(12) United States Patent
Asai et al.

(10) Patent No.: US 6,867,107 B2
(45) Date of Patent: Mar. 15, 2005

(54) VARIABLE CAPACITANCE DEVICE AND PROCESS FOR MANUFACTURING THE SAME

(75) Inventors: Akira Asai, Osaka (JP); Teruhito Ohnishi, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/456,531

(22) Filed: Jun. 9, 2003

(65) Prior Publication Data

US 2004/0094792 A1 May 20, 2004

(30) Foreign Application Priority Data

Dec. 12, 2001 (JP) .......................................... 2001-378312
Dec. 11, 2002 (JP) .................................. PCT/JP02/12949

(51) Int. Cl.[7] ............................................. H01L 21/20
(52) U.S. Cl. ........................ 438/379; 438/154; 438/155; 438/210; 438/239; 438/394; 438/395
(58) Field of Search ................................ 438/379, 394, 438/395, 154, 155, 210, 190, 237, 239; 257/350, 312, 355, 357, 595, 596, 597, 600, 532, 369

(56) References Cited

U.S. PATENT DOCUMENTS 5,629,544 A * 5/1997 Voldman et al. ............. 257/355
5,962,897 A   10/1999 Takemura et al.

FOREIGN PATENT DOCUMENTS

| GB | 2 105 106 A | 3/1983 |
| JP | 58-186973 A | 11/1983 |
| JP | 61-294874 | 12/1986 |
| JP | 1-318268 | 12/1989 |
| JP | 9-289323 | 11/1997 |
| JP | P2000-22175 A | 1/2000 |

OTHER PUBLICATIONS

Porret, et al., "Design of High–Q Varactors for Low–Power Wireless Appilcations Using a Standard CMOS Process", IEEE Journal of Solid–State Circuits, vol. 35, No. 3, Mar. 2000.*

Keqiang Shen, et al,. " A Three–Terminal SOI Gated Varactor for RF Applications," IEEE Transactions on electron device, vol. 48, Feb. 2001. pp. 289–292.

* cited by examiner

*Primary Examiner*—George Eckert
*Assistant Examiner*—Matthew Landau
(74) *Attorney, Agent, or Firm*—McDermott Will & Emery LLP (57) ABSTRACT

A variable capacitance device comprising, in a semiconductor layer formed on a substrate via an buried oxide film: an n– region 132 formed in the shape of a ring and containing an n-type dopant; an anode 133 adjoined to the outer periphery of the n– region 132, the anode 133 being formed in the shape of a ring and containing a p-type dopant; and a cathode 131 adjoined to the inner periphery of the n– region 132, the third region containing an n-type dopant, wherein the dopant concentration in the n– region 132 is lower than that in each of the anode 133 and the cathode 131.

5 Claims, 11 Drawing Sheets

VARIABLE CAPACITANCE DEVICE AND PROCESS FOR MANUFACTURING THE SAME

TECHNICAL FIELD

The present invention relates to a variable capacitance device formed on a silicon-on-insulator (SOI) substrate and a process for manufacturing the same.

BACKGROUND ART

Semiconductor devices, as represented by MOSFET devices that use silicon semiconductors, are integrated onto a single substrate and perform various functions, and thus have been used in a wide range of precision equipment, such as computers that are now a fundamental necessity of daily life. With the astonishingly rapid advancements in silicon semiconductor device technology, the demand exists for higher-performance and lower-cost integrated circuits.

Among such semiconductor devices, SOI transistors, which use an SOI substrate, have been attracting attention in recent years. SOI transistors are used particularly in compact, wireless equipment, such as cellular phones, and in portable computers. To accommodate the continuing demand for smaller size, lighter weight, lower power consumption and wireless network connections for such products, various sorts of SOI transistors have been researched and developed.

Using an SOI substrate is advantageous because it can reduce the entry of noise from digital circuits into analog circuits in a mixed digital/analog integrated circuit, which has been a problem to date. Because of this advantage, integrated circuits using an SOI substrate are expected to be applied mainly to mixed digital/analog integrated circuits incorporating a wireless circuit. For example, Japanese Unexamined Patent Publication No. 1998-256493 discloses a semiconductor device in which such an SOI substrate is used.

In an analog circuit for wireless communications, in addition to transistors, a number of other integrated circuit elements are required and should be fabricated on the SOI substrate, including high-resistive elements and a capacitor. A variable capacitance diode, used in the circuitry where wireless frequencies are controlled, is one such element.

Figure 10:
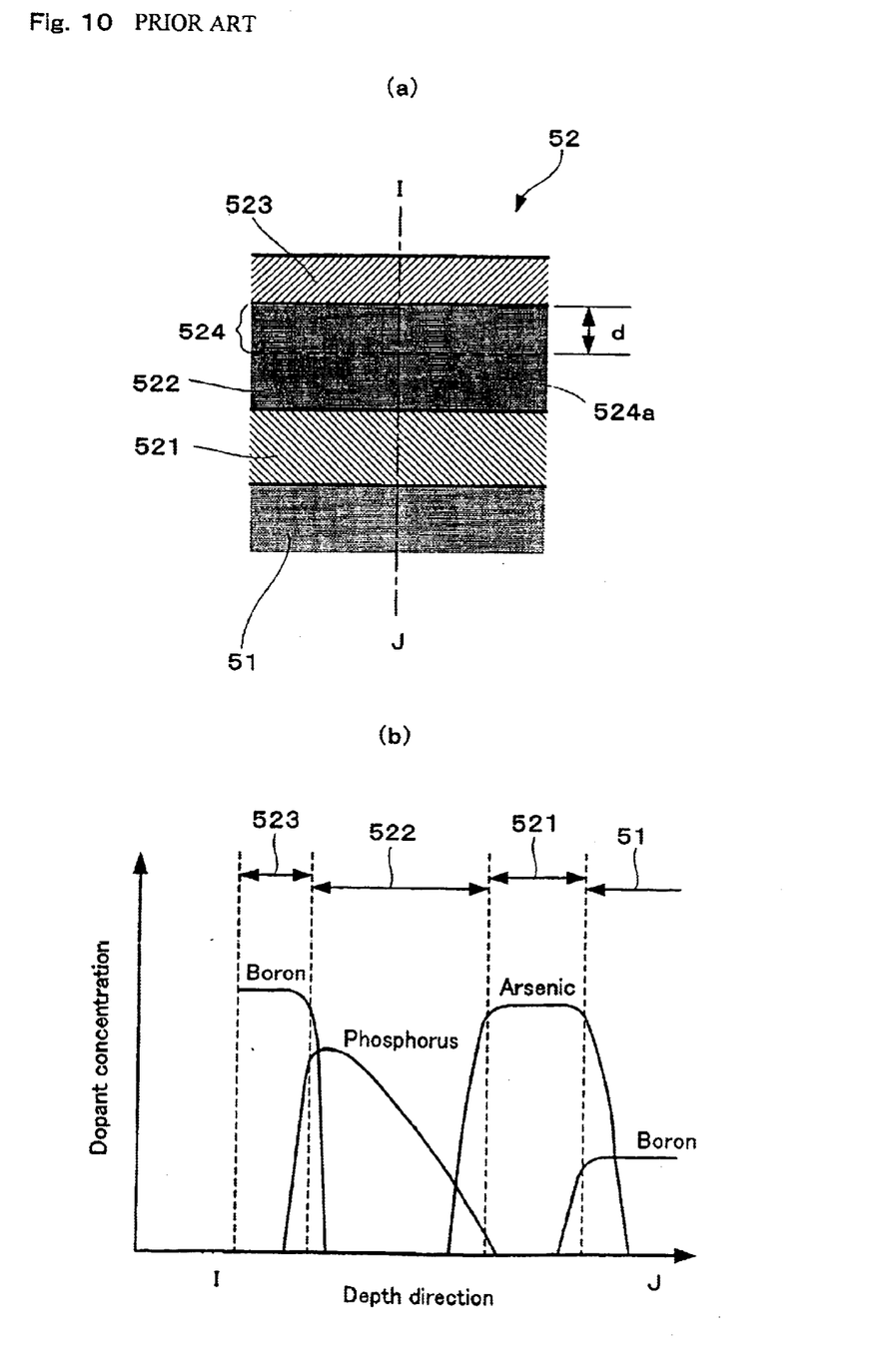

In a conventional integrated circuit using a bulk substrate, a variable capacitance diode is formed vertically by optimizing the doping profile of impurities with an ion implantation technique, one example of which is shown in FIG. 10.

FIG. 10(a) is a cross-sectional view of a vertical variable capacitance diode used in a bulk substrate integrated circuit, and FIG. 10(b) is a diagram showing the doping profile along line I–J of FIG. 10(a). As shown in FIG. 10(a), in the vertical variable capacitance diode 52, an buried cathode (n+ region) 521, an n– region 522, and an anode (p+ region) 523 are formed in this order on a silicon substrate 51. Also, the doping profile of the phosphorus impurity within the n– region 522 is adjusted by means of an ion implantation technique, as described earlier, such that the dopant concentration decreases gradually from the anode 523 side toward the cathode 521 side, as shown in FIG. 10(b).

At the interface between the anode 523 and the n– region 522 in the variable capacitance diode 52, a pn junction is formed, which acts as a capacitor. Because the dopant concentration is adjusted as described above, a depletion layer 524 of the pn junction that acts as a capacitor spreads through most of the n– region 522. More specifically, the anode 523-side edge of the depletion layer 524 is located approximately in the vicinity of the interface between the n– region 522 and the anode 523, while the cathode 521-side edge of the depletion layer 524 is located near the center of the n– region 522. In FIG. 10(a), the cathode 521-side edge of the depletion layer 524 is indicated as depletion layer edge 524a.

Generally, the junction capacitance C of a diode is expressed in the same way as that of a parallel-plate capacitor having two plates with surface area S, given by:

$$C = \in_0 \in_{Si} \times S/d \tag{1}$$

where d is the distance between the two parallel plates, which is equivalent to the width d of the depletion layer of the pn junction in FIG. 10(a), $\in_0$ is the dielectric constant in a vacuum, and $\in_{Si}$ is the relative dielectric constant of silicon. When a semiconductor material other than silicon is used, the relative dielectric constant intrinsic to the material is applied instead.

Based on formula (1), when reverse bias voltage is applied to the pn junction, the width d of the depletion layer increases, and the capacitance C is reduced. This presents a problem in that, when the width d of the depletion layer is increased due to an increase in the reverse bias voltage, the change in the capacitance C is reduced accordingly, because the capacitance C varies in inverse proportion to the width d of the depletion layer.

As a solution to the above problem, the n– region 522 of the variable capacitance diode 52 is doped such that the dopant concentration decreases gradually, as shown in FIG. 10(b). Hence, as the width d of the depletion layer increases due to an increase in reverse bias voltage, the depletion layer edge 524a moves toward the region with a lower concentration of phosphorus, thereby enlarging the variation in the depletion layer 524. Consequently, a reduction in the capacitance change ratio due to an increase in reverse bias voltage is prevented.

However, a problem arises when attempting to form such a variable capacitance diode on an SOI substrate. A conventional device with a planar (horizontal) shape may be applied in its originally designed shape to an SOI integrated circuit in the same way as it is to a bulk substrate integrated circuit. However, a conventional device with a vertical shape, i.e., the variable capacitance diode described above, is very difficult to apply in its originally designed shape to an SOI integrated circuit in the same way as it is to a bulk substrate integrated circuit because the active silicon layer of the SOI substrate is thin.

Figure 11:
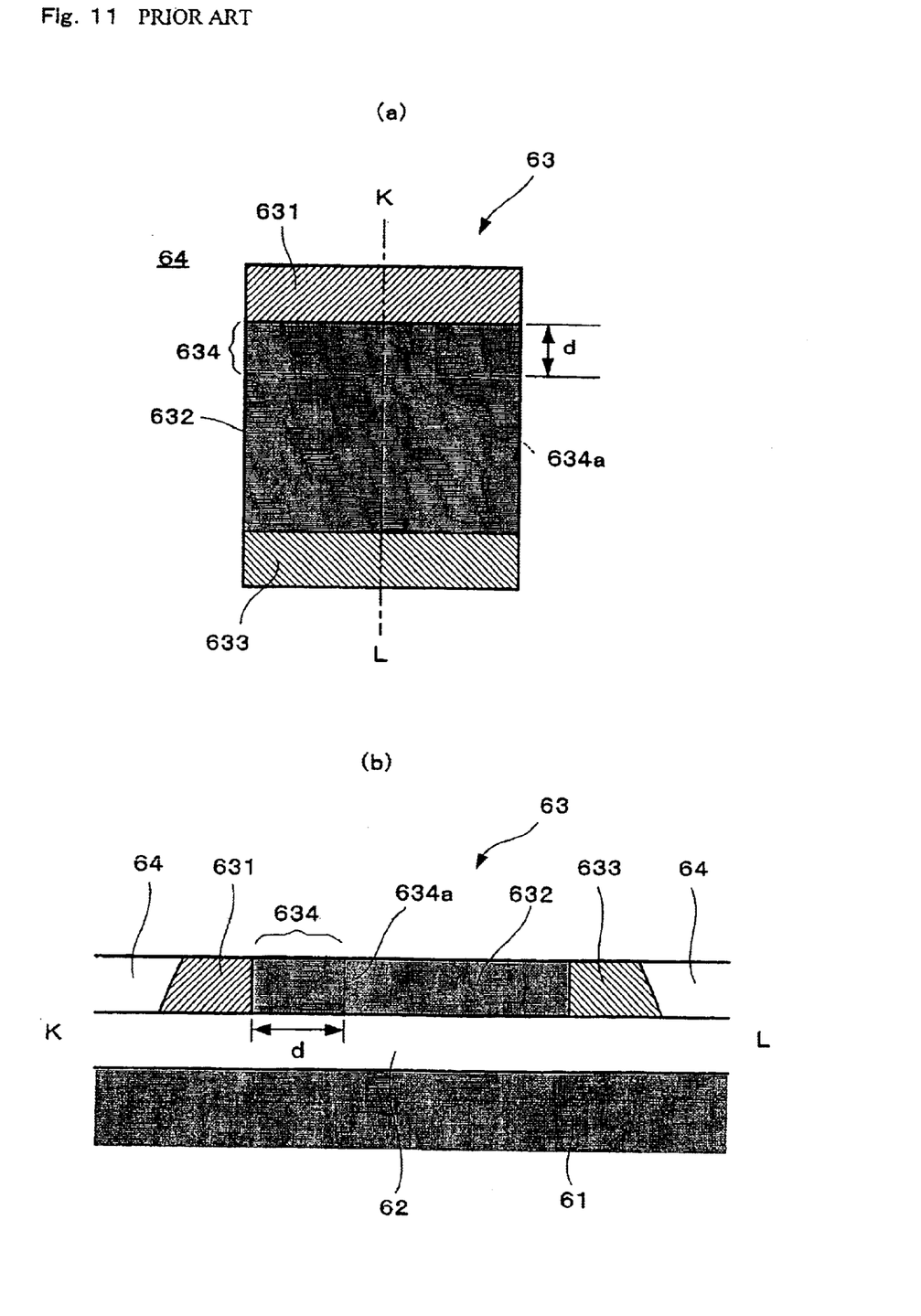

One possible approach is to simply form the variable capacitance diode in a planar shape on an SOI substrate, an example of which is shown in FIG. 11. FIG. 11(a) is a plan view of a variable capacitance diode formed in a planar shape on a conventionally structured SOI substrate, and FIG. 11(b) is a cross-sectional structural view taken on line K–L of FIG. 11(a).

As shown in FIG. 11(b), an buried oxide film 62 is formed on the top of a silicon substrate 61 to electrically isolate the silicon substrate 61 from a silicon layer thereabove, in which the device, i.e., the variable capacitance diode 63, will be formed. The variable capacitance diode 63 formed on the buried oxide film 62 is composed of an anode (p+ region) 631, an n– region 632 and a cathode (n+ region) 633. Around the variable capacitance diode 63, a device isolation oxide film 64 is formed to electrically isolate the diode from other devices.

As shown in FIG. 11(a), the variable capacitance diode 63 has the overall shape of a rectangle, and comprises the rectangular anode 631 along one end thereof and the rectangular cathode 633 along the other end thereof. The rectangular n– region 632 is sandwiched between the anode 631 and the cathode 633, which are almost identical to each other in shape. In the variable capacitance diode 63, there are high concentrations of the p-type dopant in the anode 631 (e.g., boron or indium) and the n-type dopant in the cathode 633 (e.g., phosphorus or arsenic), while the concentration of the dopant in the n– region 632 (e.g., phosphorus or arsenic) is low.

At the interface between the anode 631 and the n– region 632 in the variable capacitance diode 63, a pn junction is formed, which will act as a capacitor, as in the case of the vertical variable capacitance diode described earlier. The anode 631-side edge of a depletion layer 634 is located substantially near the interface between the n– region 632 and the anode 631, while the cathode 633-side edge of the depletion layer 634, i.e., depletion layer edge 634a, is located near the center of the n– region 632.

However, a problem arises again when such a variable capacitance diode is simply implemented in a planar shape on an SOI substrate. In the variable capacitance diode formed in a planar shape shown in FIG. 11, it is very difficult to dope the n– region such that the dopant concentration decreases gradually from the anode side toward the cathode side in the horizontal direction as is done in the vertical variable capacitance diode. As a consequence, when the width d of the depletion layer is increased by an increase in reverse bias voltage, the change in the capacitance C is reduced accordingly, as specified by formula (1). The problem, therefore, is that when a conventional variable capacitance diode is simply fabricated in a planar shape on an SOI substrate, its capacitance change ratio is small, therefore failing to provide the performance desired for an analog circuit.

An object of the present invention is to solve the above-mentioned problems and provide a variable capacitance diode with a planar shape which is formed on an SOI substrate and which can prevent a reduction in the capacitance change ratio even when the applied reverse bias voltage is increased, and a process for manufacturing the same.

DISCLOSURE OF THE INVENTION

A variable capacitance device according to the first invention for achieving the above object comprises, in a semiconductor layer formed on a substrate via an insulating layer: a first region containing a first conductivity type dopant and formed in the shape of a ring; a second region adjoined to the outer periphery of the first region, the second region being formed in the shape of a ring and containing a second conductivity type dopant; and a third region adjoined to the inner periphery of the first region, the third region containing the first conductivity type dopant. The dopant concentration in the first region is lower than that in each of the second region and the third region.

A process for manufacturing a variable capacitance device according to the second invention for achieving the above object comprises the steps of: forming a first region in a semiconductor layer formed on a substrate via an insulating layer, the first region containing a first conductivity type dopant; forming a second region in the inner peripheral portion of the first region, the second region containing a second conductivity type dopant at a higher dopant concentration than that of the first region; and forming a third region in the center of the first region and apart from the second region, the third region containing the first conductivity type dopant at a higher dopant concentration than that of the first region.

A variable capacitance device according to the third invention for achieving the above object comprises, in a semiconductor layer formed on a substrate via an insulating layer: a first region containing a first conductivity type dopant; a second region adjoined to the first region and containing a second conductivity type dopant; and a third region adjoined to the first region and containing the first conductivity type dopant, the contact area between the third region and the first region being smaller than that between the first region and the second region. The dopant concentration in the first region is lower than that in each of the second region and the third region.

A process for manufacturing a variable capacitance device according to the fourth invention for achieving the above object comprises the steps of: forming a first region in a semiconductor layer formed on a substrate via an insulating layer, the first region containing a first conductivity type dopant; forming a second region at one end of the first region, the second region containing a second conductivity type dopant at a higher dopant concentration than that of the first region; and forming a third region at the other end of the first region, the third region containing the first conductivity type dopant at a higher dopant concentration than that of the first region, the contact area between the third region and the first region being smaller than that between the first region and the second region.

BRIEF DESCRIPTION OF THE DRAWINGS

FIG. 1 illustrates the first embodiment of a variable capacitance device according to the present invention, wherein FIG. 1(a) is a plan view of the variable capacitance device and FIG. 1(b) is a cross-sectional view taken on line A–B of FIG. 1(a).

FIG. 3 illustrates the second embodiment of the variable capacitance device according to the present invention, wherein FIG. 3(a) is a plan view of the variable capacitance device and FIG. 3(b) is a cross-sectional view taken on line C–D of FIG. 3(a).

FIG. 5 illustrates the third embodiment of the variable capacitance device according to the present invention, wherein FIG. 5(a) is a plan view of the variable capacitance device and FIG. 5(b) is a cross-sectional view taken on line E–F of FIG. 5(a).

FIG. 7 illustrates the fourth embodiment of the variable capacitance device according to the present invention, wherein FIG. 7(a) is a plan view of the variable capacitance device and FIG. 7(b) is a cross-sectional view taken on line G–H of FIG. 7(a).

FIG. 10 illustrates a conventional variable capacitance device, wherein FIG. 10(a) is a cross-sectional view of the variable capacitance device and FIG. 10(b) is a diagram showing the doping profiles along line I–J of FIG. 10(a).

FIG. 11 illustrates a conventional variable capacitance device, wherein FIG. 11(a) is a plan view of the variable capacitance device and FIG. 11(b) is a cross-sectional view taken on line K–L of FIG. 11(a).

BEST MODE FOR CARRYING OUT THE INVENTION (First Embodiment)

The first embodiment of a variable capacitance device according to the present invention will be described below with reference to FIG. 1. FIG. 1(a) is a plan view of the variable capacitance device of the first embodiment, and FIG. 1(b) is a cross-sectional view taken on line A–B of FIG. 1(a).

Figure 1:
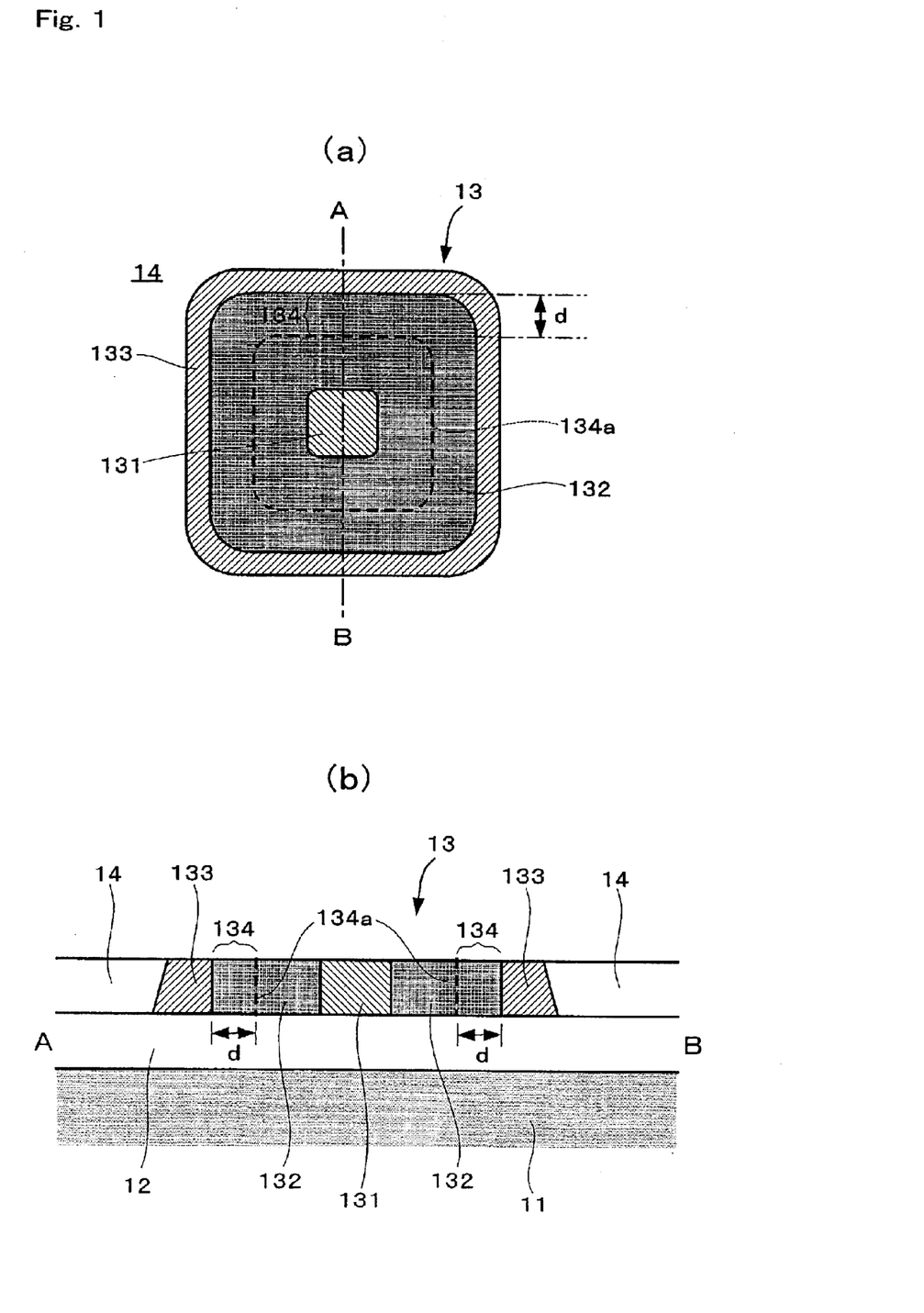

According to the first embodiment, as shown in FIG. 1, a variable capacitance diode 13 with a planar shape is formed on a silicon substrate 11 via an buried oxide film (insulating layer) 12. The variable capacitance diode 13 comprises a rectangular cathode (n+ region) 131 formed by doping a silicon layer with an n-type dopant, a rectangular ringed n– region 132 disposed so as to surround the cathode 131 and formed by doping the silicon layer with an n-type dopant, and a rectangular ringed anode (p+ region) 133 disposed so as to surround the n– region 132 and formed by doping the silicon layer with a p-type dopant. The dopant concentrations in the anode 133 and the cathode 131 are high, while the dopant concentration in the n– region 132 is low.

Around the variable capacitance diode 13 thus structured, a device isolation oxide film (device isolation region) 14 is formed to electrically isolate the variable capacitance diode 13 from other semiconductor devices, for example, MOSFETs, which will be described later. In the first embodiment, the cathode 131, the n– region 132, and the anode 133 correspond to the third region, the first region, and the second region, respectively, according to the present invention. In addition, the n-type and p-type correspond to the first conductivity type and second conductivity type, respectively, according to the present invention.

Now, with reference to the drawings, a process for manufacturing the variable capacitance diode having the above structure will be described below. The variable capacitance diode of the first embodiment can be manufactured by partially utilizing a conventional manufacturing process for SOI transistors. The following relates to the case where the variable capacitance diode is manufactured together with a CMOS SOI transistor, which is composed of a p-channel MOSFET (hereinafter referred to as a "pMOSFET") and an n-channel MOSFET (hereinafter referred to as an "nMOSFET").

Figure 2:
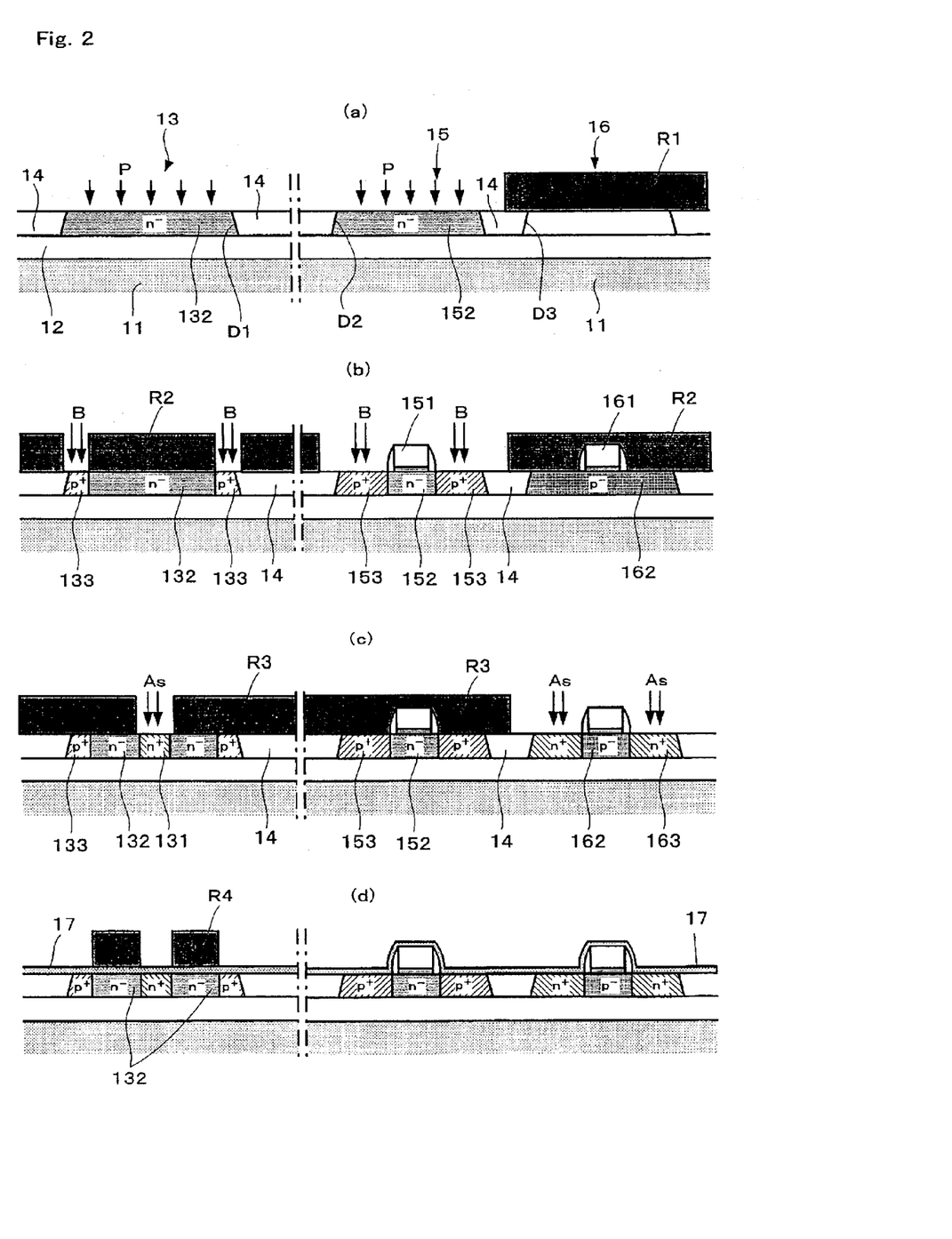
FIG. 2 depicts a process for manufacturing the variable capacitance device of FIG. 1.

FIG. 2 is a diagram illustrating a process for manufacturing the variable capacitance diode of the first embodiment. First, an SOI substrate having the silicon layer (omitted from the drawing) formed on the silicon substrate 11 via the buried oxide film 12 is prepared as a starting substrate. In the silicon layer of the SOI substrate, the device isolation oxide film 14 is formed by the conventional process, that is, local oxidation of silicon or shallow trench isolation, so as to leave a rectangular section wherein the variable capacitance diode 13 with a planar shape will be formed, i.e., a first semiconductor-device-forming section D1. This device isolation oxide film 14 is formed concurrently with the device isolation oxide film 14 which serves to isolate from other sections a second semiconductor-device-forming section D2, wherein the pMOSFET 15 will be formed, and a third semiconductor-device-forming section D3, wherein the nMOSFET 16 will be formed.

Successively, at the SOI transistor side, a resist pattern R1 is formed to mask the third semiconductor-device-forming section D3, wherein the nMOSFET 16 will be formed. Then, by doping with phosphorus, the n– region 132 is formed in the first semiconductor-device-forming section D1. Concurrent with the formation of the n– region 132, an n– region 152 (fourth region) is also formed in the second semiconductor-device-forming section D2 (FIG. 2(a)). The dopant concentrations in the n– regions 132 and 152 are about $10^{16}$ to $10^{18}$ ions per cm$^3$.

Then, after removing the resist pattern R1, a p-type impurity diffused region 162 (fifth region; hereinafter referred to as a p– region) is formed in the third semiconductor-device-forming section D3 and, thereafter, gate electrodes 151 and 161 are formed on the second and third semiconductor-device-forming sections D2 and D3, respectively. After this, a resist pattern R2 is formed over the device isolation oxide film 14 at the variable capacitance diode 13 side and on the central portion of the n– region 132. On the n– region 132, the resist pattern R2 appears in the shape of a rectangle so as to leave a region in which to form the anode 133. Along with this formation, the resist pattern R2 is also formed over the third semiconductor-device-forming section D3. Then, the areas other than those masked by the resist pattern R2 are doped with boron, thereby forming p+ regions. More specifically, at the variable capacitance diode 13 side, the anode 133 is formed in the inner peripheral portion of the n– region 132, while in the second semiconductor-device-forming section D2, a p+ region 153 (sixth region) is formed so as to surround the gate electrode 151, which acts as a mask (FIG. 2(b)). After the formations of the p+ regions 133 and 153, the resist pattern R2 is removed. The dopant concentrations in the p+ regions 133 and 153 are about $10^{19}$ to $10^{21}$ ions per cm$^3$.

Subsequently, a resist pattern R3 is formed at the variable capacitance diode 13 side so as to leave a region in which to form the rectangular cathode 131. Simultaneous with this formation, at the SOI transistor side, the resist pattern R3 is also formed over the second semiconductor-device-forming section D2. The exposed areas in the n– region 132 and the p– region 162 are then doped with arsenic, thereby forming n+ regions. More specifically, the cathode (n+ region) 131 is formed at the variable capacitance diode 13 side, while an n+ region 163 (seventh region) is formed in the third semiconductor-device-forming section D3 so as to surround the gate electrode 161, which acts as a mask (FIG. 2(c)). The dopant concentrations in the n+ regions 131 and 163 are about $10^{19}$ to $10^{21}$ ions per cm$^3$. It is also possible to dope with phosphorus in place of arsenic.

Thereafter, on the substrate as thus structured, a thin film 17, such as one of titanium or cobalt, is formed. Then, at the variable capacitance diode 13 side, a resist pattern R4 is formed on the thin film 17 above the n+region 132. After this, the substrate is heated so that the thin film 17 reacts with silicon at the areas that have not been masked by the resist pattern R4, thereby siliciding such areas to form titanium silicide or cobalt silicide over the p+ regions 131 and 153, the n+ regions 131 and 163, and the gate electrodes 151 and 161. The areas that have been silicided have a lowered resistance, thus improving the conductivity with the wiring connected thereto. In contrast, the substrate surface above the n– region 132 is kept free from silicidation by being masked, as described earlier, so that the resistance is not lowered.

The anode 133 and the cathode 131 in the variable capacitance diode 13 are equipped with wiring. The wiring for the anode 133 is preferably run through the region of the anode 133 in such a manner as to form a rectangular shape, instead of in just one part of the region, so that high responsiveness can be achieved even when a high-frequency voltage is applied.

In the variable capacitance diode 13 as thus structured, the dopant concentration in the anode 133 is lower than that in the n− region 132, and the dopant concentration in the n− region 132 is lower than that in the cathode 131. Accordingly, in the variable capacitance device 13, a pn junction is formed in the vicinity of the interface between the anode 133 and the n− region 132, as shown in FIG. 1. And, under thermal equilibrium conditions, a depletion layer 134 is formed approximately in the n− region 132 in such a way as to surround the cathode 131. When the depletion layer 134 is enlarged by the reverse bias voltage applied between the anode 133 and the cathode 131, the anode-side edge of the depletion layer 134 will stay approximately in the vicinity of the interface between the anode 133 and the n− region 132, while the cathode 131-side edge of the depletion layer 134, i.e., depletion layer edge 134a with a rectangular shape, will move toward the cathode 131, because of the highly concentrated dopant in the anode 133.

The relationship between the variation in applied reverse bias voltage and the variation in the circumference of the depletion layer edge can be derived by solving Poisson's equation. According to Poisson's equation, potential is calculated by integrating the electric charge twice over space, thus relating the reverse bias voltage to the circumference of the depletion layer edge. In accordance with this relation, the first embodiment is designed such that the electric charge that passes through the depletion layer edge 134a upon an increase in the reverse bias voltage progressively decreases with the increase in the reverse bias voltage, so that the depletion layer edge is led to move a longer distance, therefore effecting a larger change in the width d of the depletion layer. The details of this will be described below.

According to the first embodiment, at the variable capacitance diode 13 side, the cathode 131 is surrounded by the n− region 132, which is surrounded by the anode 133, as shown in FIG. 1. Hence, the depletion layer edge 134a is formed in the shape of a rectangular ring in such a way as to surround the cathode 131. Since the contact area between the n− region 132 and the cathode 131 is smaller than that between the anode 133 and the n− region 132, when the depletion layer edge 134a moves toward the cathode 131, its circumference shortens and, correspondingly, an additional electric charge is carried into the depletion layer 134 according to the increase in reverse bias voltage. Consequently, the depletion layer edge 134a moves a longer distance and thus effects a larger change in capacitance, compared with the conventional variable capacitance diode described earlier in the background art section. Therefore, according to the first embodiment, a variable capacitance diode with a sufficiently large capacitance change ratio can be constructed in a planar shape, therefore enabling a high-performance variable capacitance diode to be provided on an SOI substrate and ultimately permitting a high-performance SOI semiconductor integrated circuit to be implemented.

Furthermore, as described earlier, the variable capacitance diode 13 can be manufactured by partially utilizing a manufacturing process for CMOS SOI transistors, thus not requiring the addition of a process peculiar to diodes to the existing facility, and therefore enabling the low-cost manufacture of SOI semiconductor integrated circuits.

(Second Embodiment)

Figure 3:
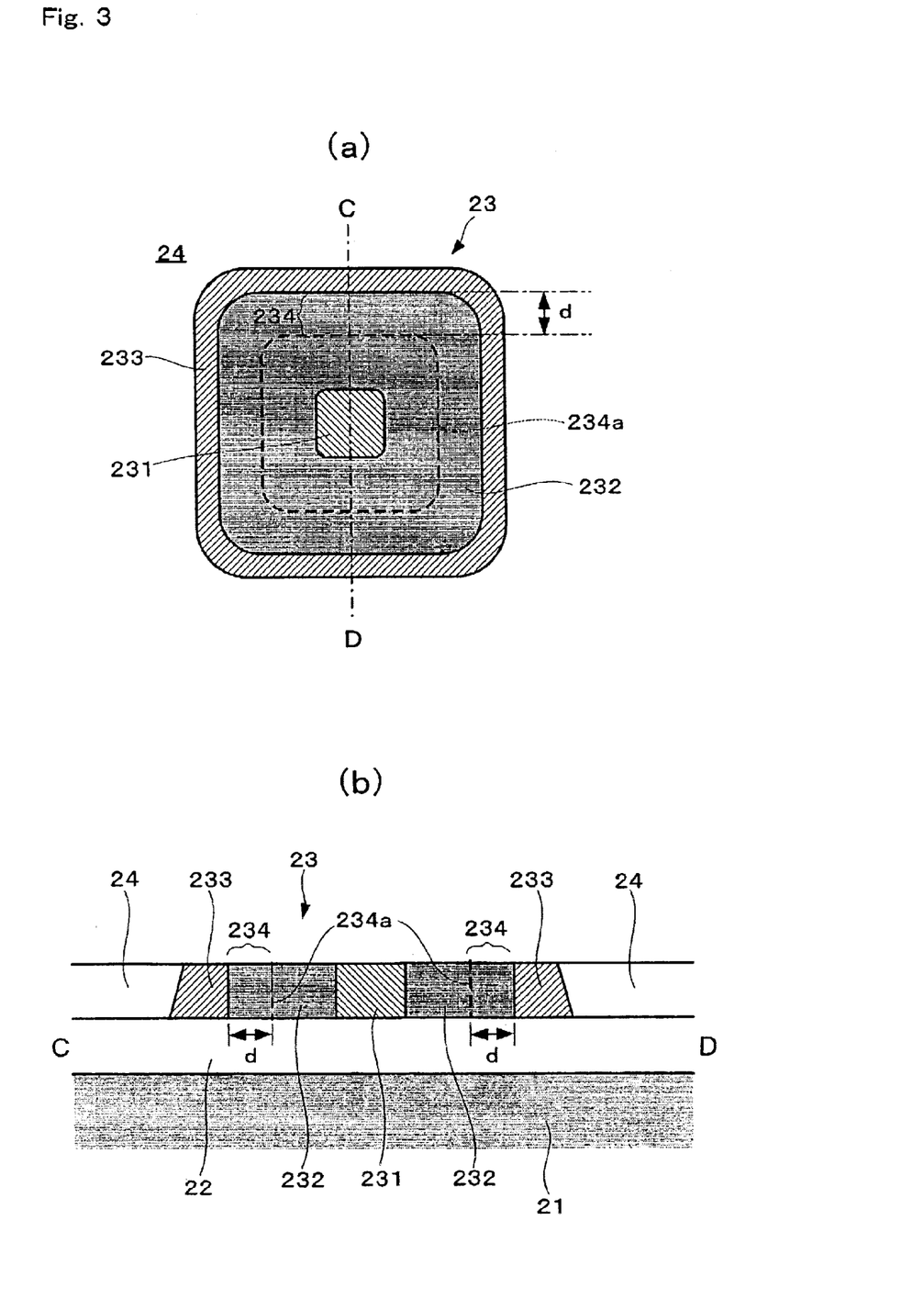

Referring now to FIG. 3, the second embodiment of the variable capacitance diode according to the present invention will be described. FIG. 3(a) is a plan view of the variable capacitance device of the second embodiment, and FIG. 3(b) is a cross-sectional view taken on line C–D of FIG. 3(a).

The variable capacitance diode of the second embodiment is structurally identical to that of the first embodiment, except that the anode and the cathode are reversed in arrangement and that the area sandwiched therebetween is doped with a p-type dopant.

As shown in FIG. 3, the variable capacitance diode 23 according to the second embodiment comprises a rectangular anode (p+ region) 231 formed by doping a silicon layer with a p-type dopant to a high concentration, a p− region 232 with a rectangular ring shape disposed so as to surround the anode 231 and formed by doping the silicon layer with a p-type dopant to a low concentration, and a cathode (n+ region) 233 with a rectangular ring shape disposed so as to surround the p− region 232 and formed by doping the silicon layer with an n-type dopant to a high concentration. In the second embodiment, the anode 231, the p− region 232, and the cathode 233 correspond to the third region, the first region, and the second region, respectively, according to the present invention. In addition, the n-type and p-type correspond to the second conductivity type and first conductivity type, respectively, according to the present invention.

Figure 4:
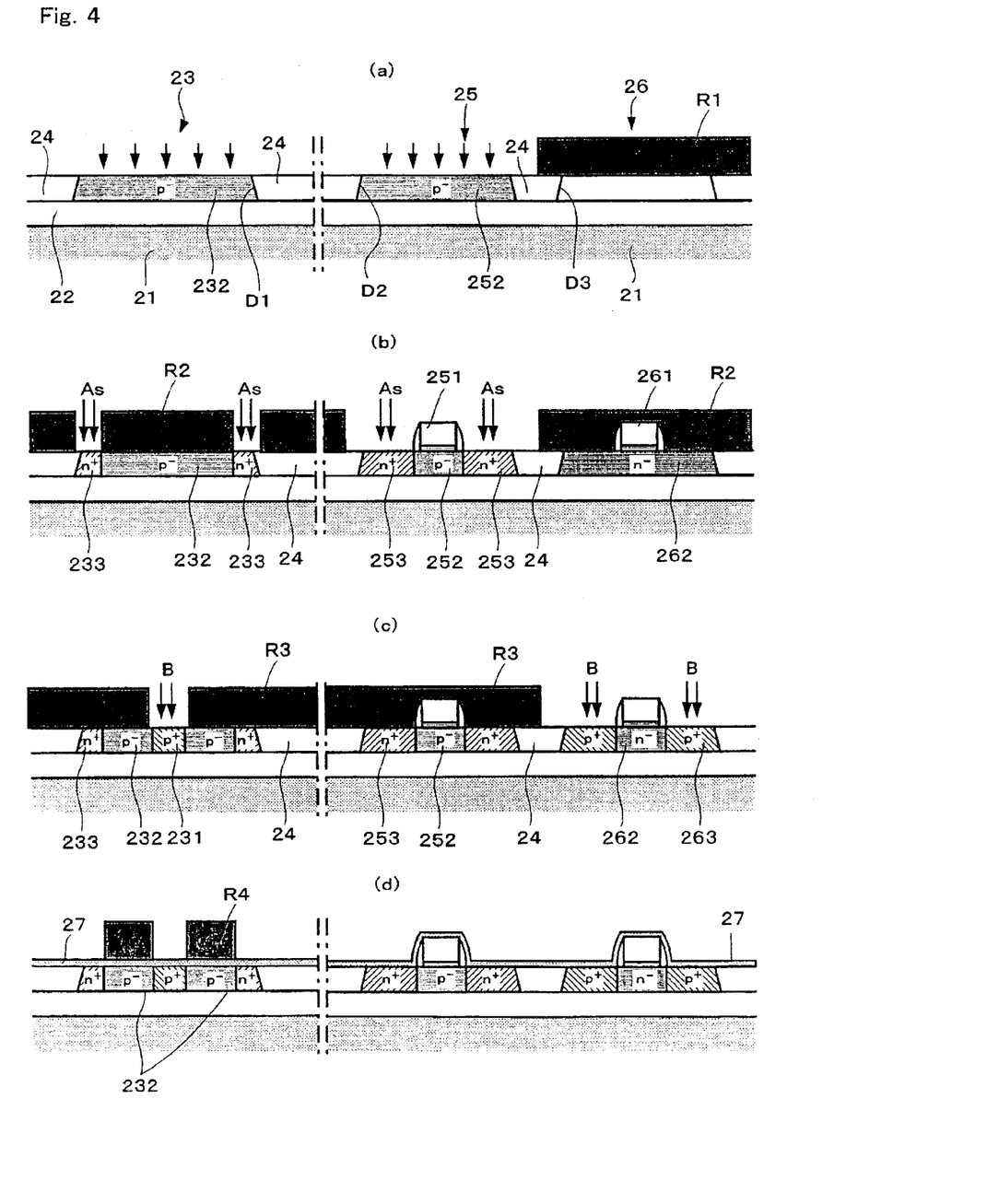
FIG. 4 depicts a process for manufacturing the variable capacitance device of FIG. 3.

The variable capacitance diode, having a structure such as that described above, can be manufactured in essentially the same manner as in the first embodiment, in other words, by partially utilizing a manufacturing process for CMOS SOI transistors. First, as shown in FIG. 4, a device isolation oxide film 24 is formed in an SOI substrate that is prepared as a starting substrate in the same way as in the first embodiment. Then, a p− type impurity diffused area, i.e., the p− region 232, is formed in the silicon layer of a first semiconductor-device-forming section D1 that is surrounded by the device isolation oxide film 24 (FIG. 4(a)). Successively, the cathode 233 is formed in the inner peripheral portion of the p− region 232 by masking the designated regions with a resist pattern R2 (FIG. 4(b)). Thereafter, the anode 231 is formed in the center of the p− region 232 by masking the designated regions with a resist pattern R3 (FIG. 4(c)). After this, a thin film 27, such as one of titanium, is formed on the surface of the substrate. Then, after masking only the p− region 232 with a resist pattern R4 (FIG. 4(d)), the surface layers of the anode 231 and the cathode 233 are silicided.

During the formation of the variable capacitance diode 23 of the second embodiment as described above, as in the first embodiment, a CMOS SOI transistor is formed in the section composed of second and third semiconductor-device-forming sections D2 and D3, each being isolated from the variable capacitance diode 23 by the device isolation oxide film 24. More specifically, concurrent with the formation of the variable capacitance device 23, a p− region 252 (fourth region), an n− region 262, an n+ region 253 (sixth region) and a p+ region 263 (seventh region) are formed, thereby forming CMOS (25 and 26). The n− region 262 in the p-channel MOSFET 26 corresponds to the fifth region according to the present invention.

As a result of the above structure, when a reverse bias voltage is applied, a depletion layer edge 234a with a rectangular ring shape, which is formed in the p− region 232 and around the anode 231, moves toward the anode 231 side, as shown in FIG. 3. As the depletion layer edge 234a approaches the anode 231, its circumference shortens and, correspondingly, an additional electric charge is carried into a depletion layer 234 according to the increase in reverse bias voltage, thus inducing the depletion layer edge 234a to move a longer distance than in the conventional case. As a consequence, as in the first embodiment, a reduction in the capacitance change ratio due to increased reverse bias voltage is prevented, thus allowing for the implementation of a planar-shaped variable capacitance diode with a sufficiently large capacitance change ratio on an SOI substrate.

(Third Embodiment)

Now, with reference to FIG. 5, the third embodiment of the variable capacitance device according to the present invention will be described below. FIG. 5(a) is a plan view of the variable capacitance device of the third embodiment, and FIG. 5(b) is a cross-sectional view taken on line E–F of FIG. 5(a).

Figure 5:
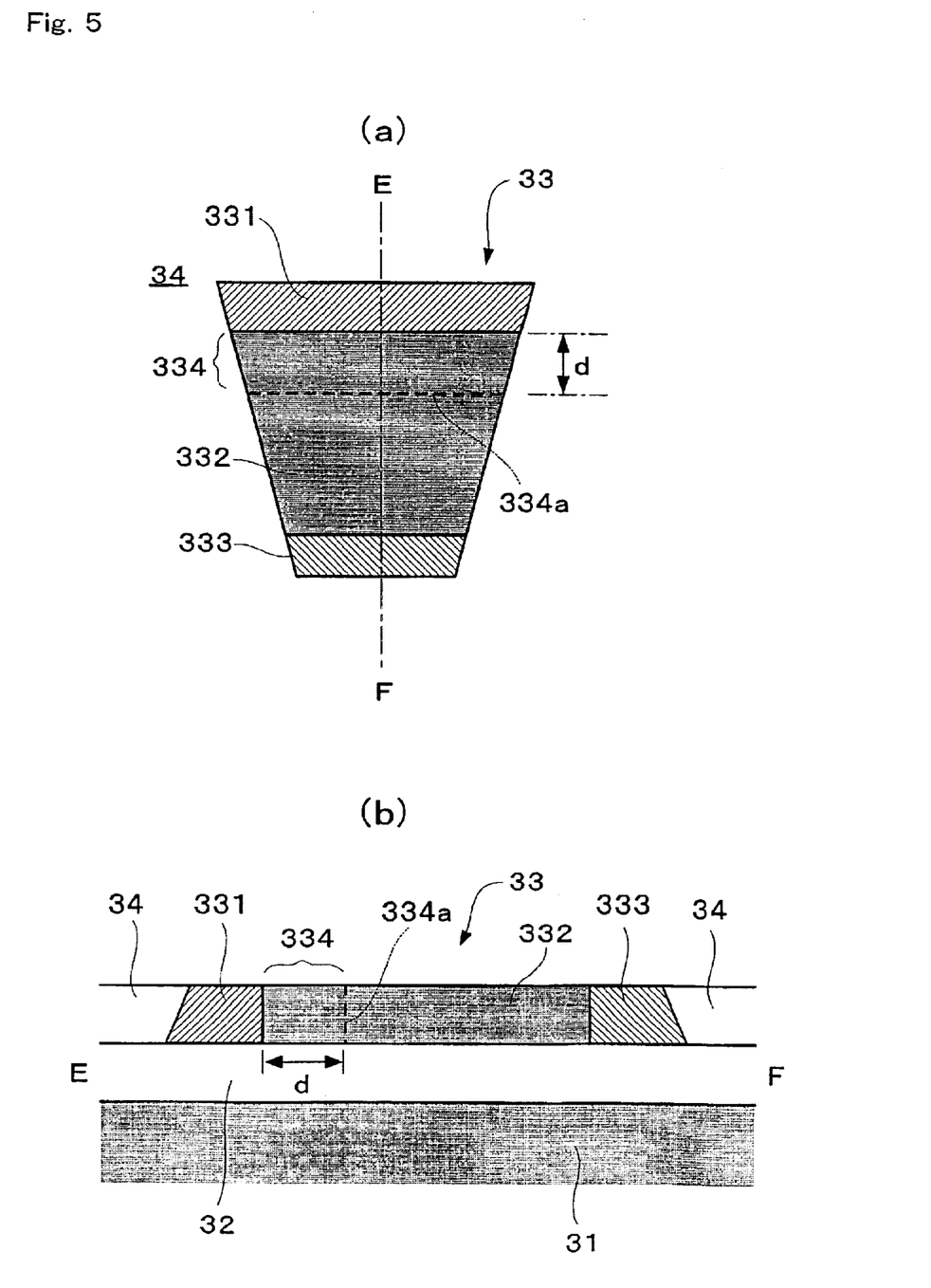

According to the third embodiment, as shown in FIG. 5, the variable capacitance diode 33 with a planar shape is formed on a silicon substrate 31 via an buried oxide film 32. The variable capacitance diode 33 has the overall shape of a trapezoid, and comprises an anode (p+ region) 331 with a trapezoidal shape formed by doping a silicon layer with a p-type dopant to a high concentration on its long side and a cathode (n+ region) 333 with a trapezoidal shape formed by doping the silicon layer with an n-type dopant to a high concentration on its short side. And, in the area sandwiched between the anode 331 and cathode 333, an n− region 332 of a trapezoidal shape is formed by doping the silicon layer with an n-type dopant to a low concentration. This structural layout allows the contact area between the anode 331 and the n− region 332 to be larger than that between the cathode 333 and the n− region 332 and, further, allows the distance between the two side edges of the n− region 332 to be shortened gradually from the anode 331 side toward the cathode 333 side.

Around the variable capacitance diode 33 as thus structured, a device isolation oxide film 34 is formed to electrically isolate the variable capacitance diode 33 from other semiconductor devices, as in the first and second embodiments. In the third embodiment, the anode 331, the n− region 332, and the cathode 333 correspond to the second region, the first region, and the third region, respectively, according to the present invention. In addition, the n-type and p-type correspond to the first conductivity type and second conductivity type, respectively, according to the present invention.

Figure 6:
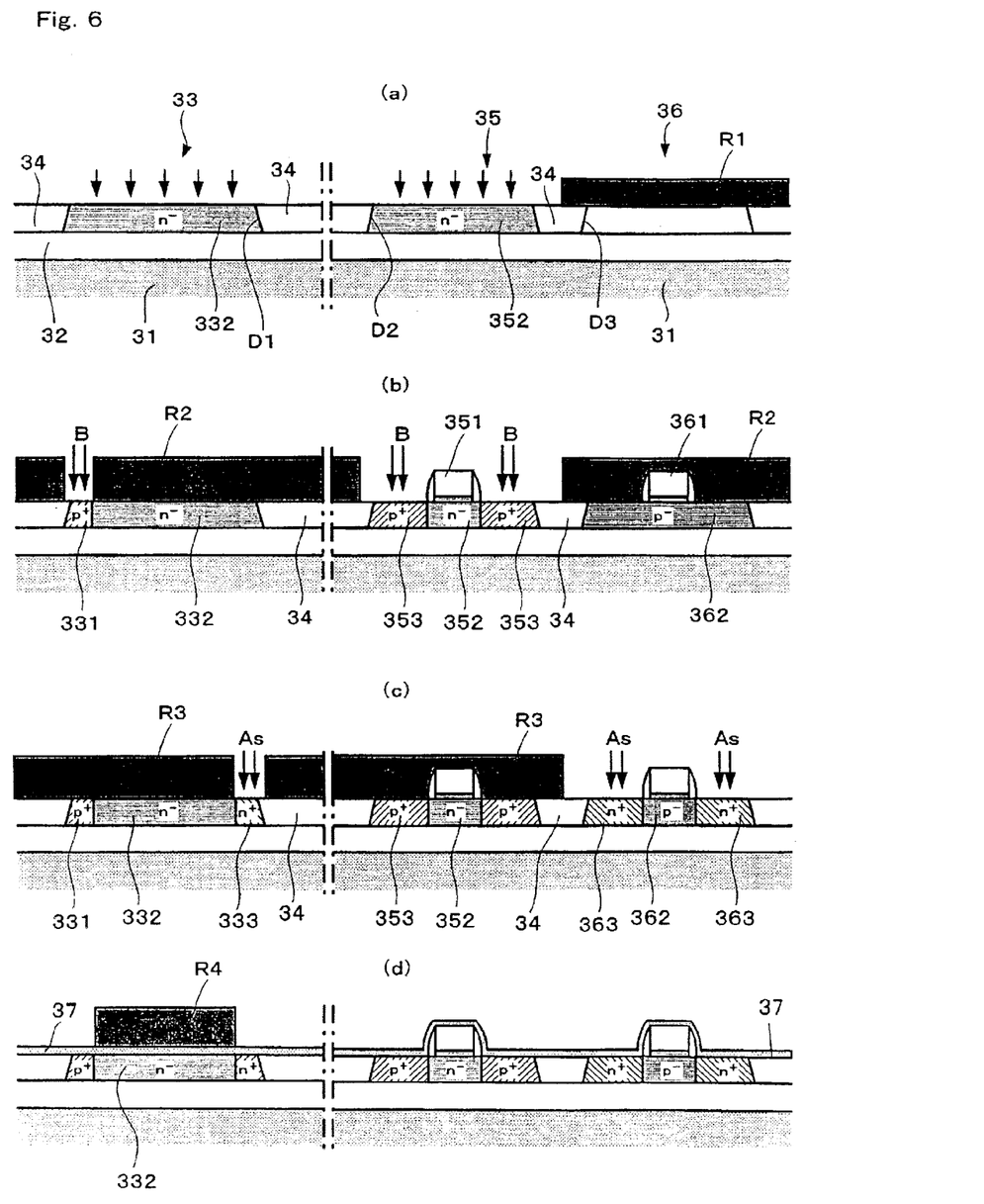
FIG. 6 depicts a process for manufacturing the variable capacitance device of FIG. 5.

The variable capacitance diode 33, having a structure as such that described above, is manufactured by the process depicted in FIG. 6, which is essentially the same as that used in the first embodiment except that it gives a different planar shape to the resulting variable capacitance diode. More specifically, as shown in the same figure, after forming a trapezoidal first semiconductor-device-forming section D1 for the variable capacitance diode 33 by forming the device isolation oxide film 34, the first semiconductor-device-forming section D1 is doped with phosphorus to a concentration as low as $10^{16}$ to $10^{18}$ ions per cm$^3$ to form the n− region 332 (FIG. 6(a)). Then, after forming a resist pattern R2 over desired regions, one end of the n− region 332 is doped with boron to a concentration as high as $10^{19}$ to $10^{21}$ ions per cm$^3$, thereby forming the anode 331 (FIG. 6(b)). Subsequently, after forming a resist pattern R3 over desired regions, the other end of the n− region 332 is doped with arsenic to a concentration as high as $10^{19}$ to $10^{21}$ ions per cm$^3$, thereby forming the cathode 333 (FIG. 6(c)). As a final step, after forming a thin film 37, such as one of titanium, on the substrate, a resist pattern R4 is formed on the n− region 332 (FIG. 6(d)), followed by silicidation of the surface layers of the areas other than the n− region 332. As in the first embodiment, a CMOS SOI transistor (35 and 36) is formed concurrent with the formation of the variable capacitance diode 33.

The variable capacitance diode 33 as thus structured allows the contact area between the anode 331 and the n− region 332 to be larger than that between the cathode 333 and the n− region 332 and, further, allows the distance between the two side edges of the n− region 332 to be shortened gradually from the anode 331 side toward the cathode 333 side, meaning that the same effect can be achieved as in the first and second embodiments. More specifically, since the distance between the two side edges of the n− region 332 shortens gradually from the anode 331 side toward the cathode 333 side, as shown in FIG. 5(a), when a depletion layer edge 334a moves toward the cathode 333 due to the application of a reverse bias voltage, its length shortens and, correspondingly, an additional electric charge is carried into a depletion layer 334, thus leading the depletion layer edge 334a to move a longer distance than in the case of the conventional variable capacitance diode described earlier in the background art section and, consequently, increasing the capacitance change ratio of the variable capacitance diode. Such an effect enables the formation of a planar-shaped variable capacitance diode with a sufficiently large capacitance change ratio on an SOI substrate, thus permitting the implementation of a high-performance SOI semiconductor integrated circuit.

(Fourth Embodiment)

Figure 7:
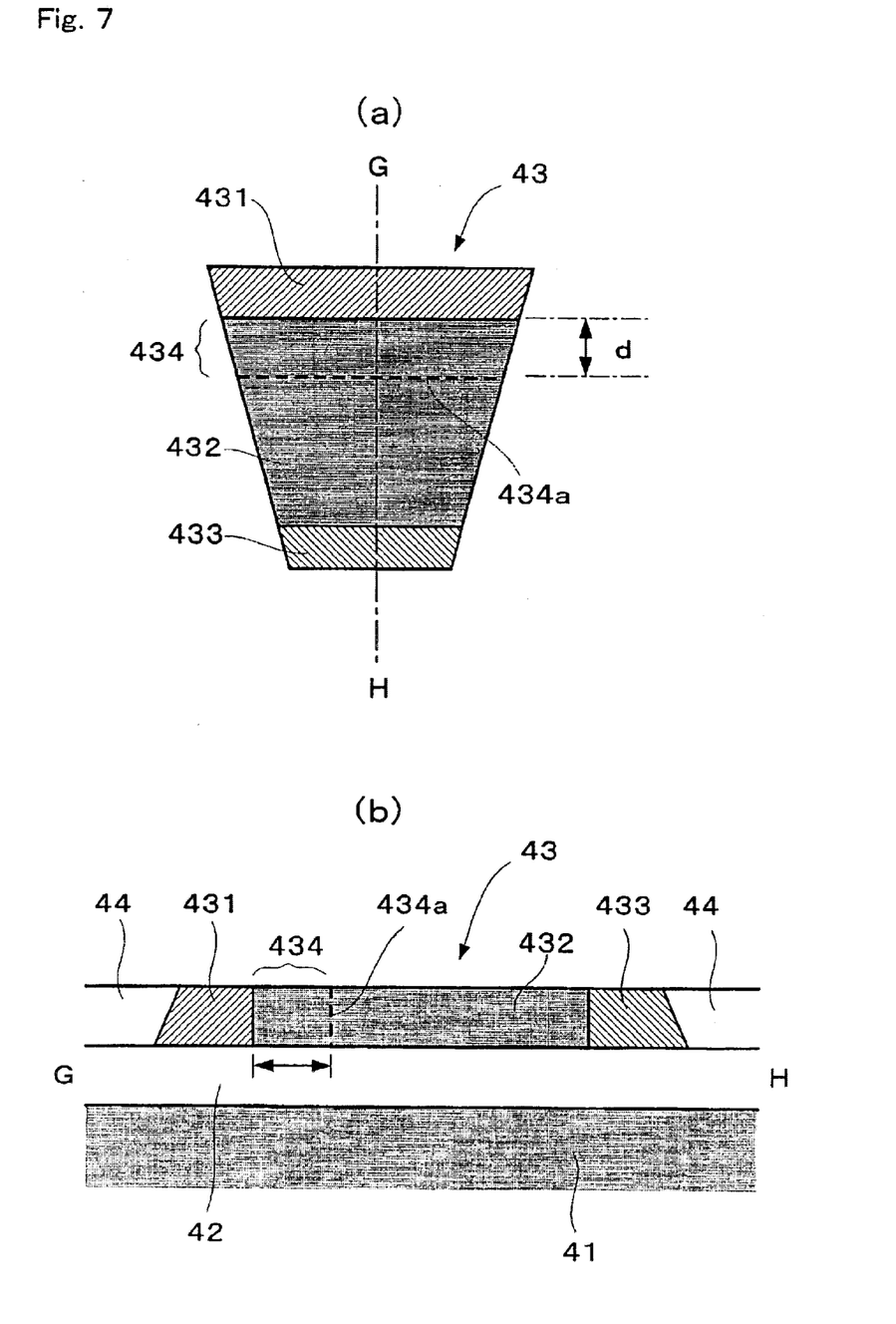

Referring next to FIG. 7, the fourth embodiment of the variable capacitance device according to the present invention will be described below. FIG. 7(a) is a plan view of the variable capacitance device of the fourth embodiment, and FIG. 7(b) is a cross-sectional view taken on line G–H of FIG. 7(a).

The variable capacitance diode of the fourth embodiment is structurally identical to that of the third embodiment, except that the anode and the cathode are reversed in arrangement and that the area sandwiched therebetween is doped with a p-type dopant.

As shown in FIG. 7, the variable capacitance diode 43 has the overall shape of a trapezoid, and comprises a cathode (n+ region) 431 with a trapezoidal shape formed by doping a silicon layer with an n-type dopant to a high concentration on its long side and an anode (p+ region) 433 with a trapezoidal shape formed by doping the silicon layer with a p-type dopant to a high concentration on its short side. In the area sandwiched between the anode 433 and the cathode 431, a p− region 432 with a trapezoidal shape is formed by doping the silicon layer with a p-type dopant to a low concentration. This structural layout allows the contact area between the cathode 431 and the p− region 432 to be larger than that between the anode 433 and the p− region 432 and, further, allows the distance between the two side edges of the p− region 432 to be shortened gradually from the cathode 431 side toward the anode 433 side. In the fourth embodiment, the anode 433, the p− region 432, and the cathode 431 correspond to the third region, the first region, and the second region, respectively, according to the present invention. In addition, the p-type and n-type correspond to the first conductivity type and second conductivity type, respectively, according to the present invention.

Figure 8:
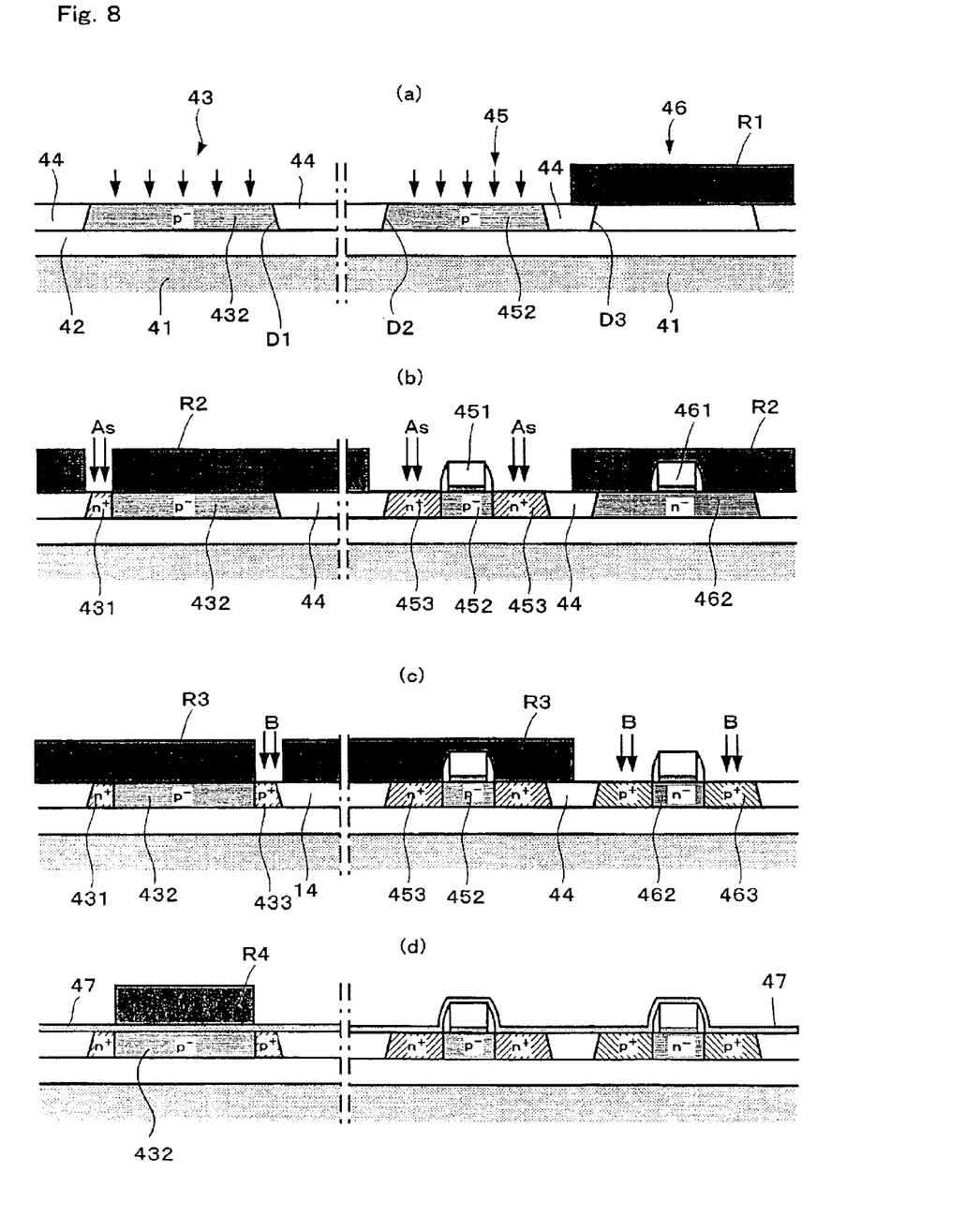
FIG. 8 depicts a process for manufacturing the variable capacitance device of FIG. 7.

The variable capacitance diode, having a structure as such that described above, is manufactured by following the process depicted in FIG. 8. The description of the process is omitted here on account of the fact that the variable capacitance diode of the fourth embodiment is structurally identical to that of the third embodiment except that the anode and the cathode are reversed in arrangement and that the area sandwiched therebetween is doped with a p-type dopant.

The fourth embodiment can, therefore, provide the same effect as the foregoing embodiments. More specifically, a reduction in the capacitance change ratio of the variable capacitance diode due to increased reverse bias voltage is prevented, thus allowing for the formation of a high-performance variable capacitance device with a planar shape on an SOI substrate.

Although the present invention has been described in terms of specific embodiments, the invention is not limited to the above embodiments and various modifications thereof may be made without departing from the scope of the present inventive concepts. For example, the external shape of the variable capacitance diode of the first or second embodiment may not necessarily be a rectangle, and may be selected from various other shapes, such as a circle or a polygon. Accordingly, the shapes of the first and second regions constituting such a diode may also be selected from various other shapes, such as a circular ring or a polygonal ring, depending on the external shape of the diode.

Figure 9:
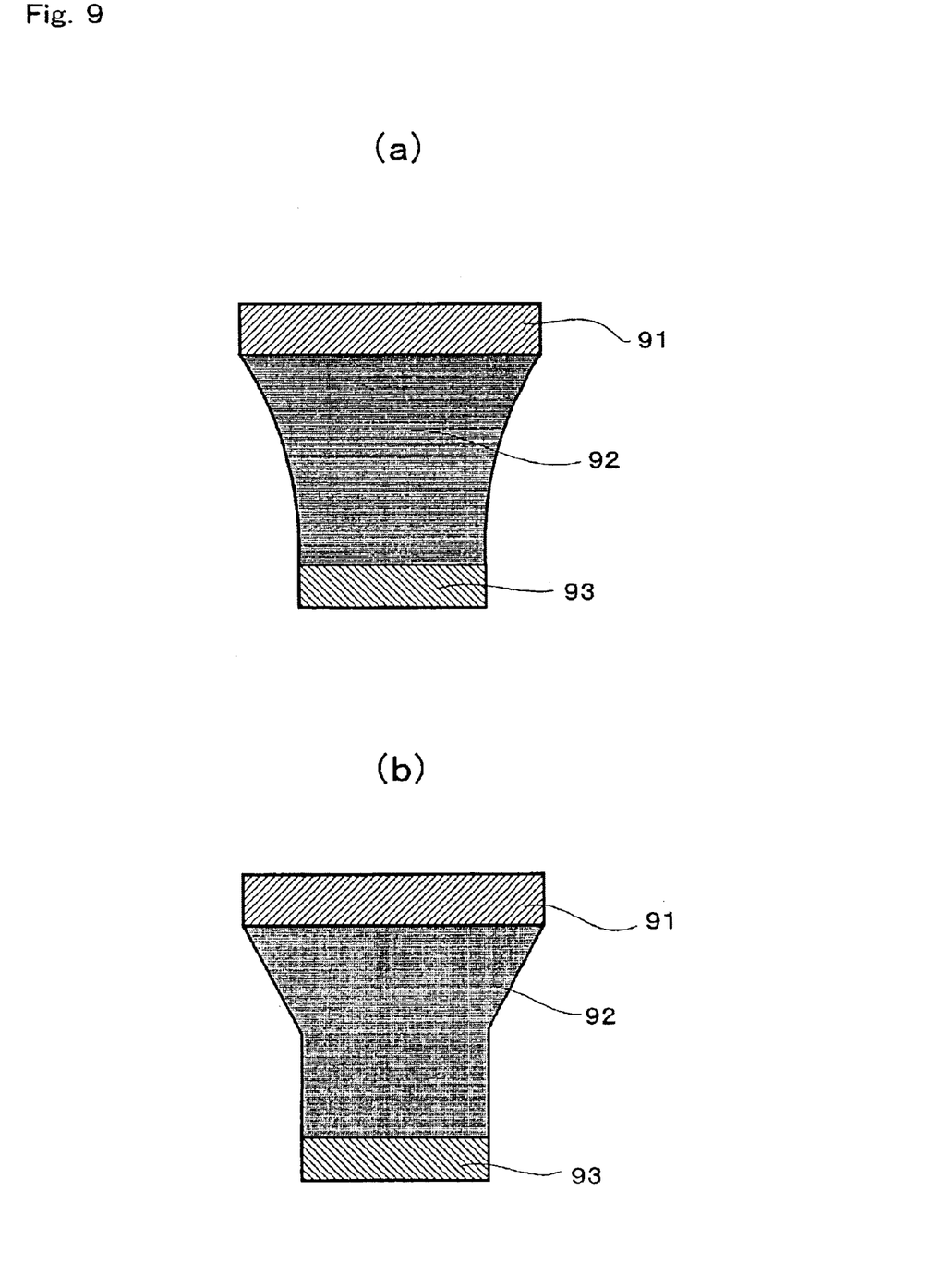
FIG. 9 is a plan view showing another example of the variable capacitance device of the third embodiment.

Furthermore, the shape of the n– region of the third or fourth embodiment, which is presently a trapezoid, may also be selected from other shapes, including those shown in FIGS. 9(a) and (b). In FIG. 9(a), the two side edges of an n– region 92 extend in a curvilinear fashion between an anode 91 and a cathode 93, whereas in FIG. 9(b), the distance between the two side edges of the n– region 92 shortens gradually in one part of the region. Other alternative shapes are also possible, as long as the contact area between the anode and the n– region or that between the cathode and the n– region, whichever is forming a pn junction, is larger than the other.

Although the variable capacitance diode is fabricated together with the CMOS SOI transistor in each of the aforementioned embodiments, it need not be so fabricated, and may be fabricated, for example, together with one or more other semiconductor devices having the same regions as the diode.

Furthermore, although the semiconductor layer containing silicon is formed on the buried oxide film in each of the aforementioned embodiments, the semiconductor layer need not contain silicon as a semiconductor material, and may alternatively contain, for example, SiGe, SiGeC or SiC, or may even be a composite film of silicon and one of such alternative materials.

The variable capacitance device of the present invention may be used in various precision equipment, such as wireless local area networks, radios, cellular phones, other networks, and the like.

What is claimed is:

1. A process for manufacturing a variable capacitance device comprising the steps of;

forming a first region in a semiconductor layer formed on a substrate via an insulating layer, the first region containing a first conductivity type dopant;

forming a second region in a portion of the first region, the second region containing a second conductivity type dopant at a higher dopant concentration than that of the first region; and forming a third region in a portion of the first region and apart from the second region, the third region containing a first conductivity type dopant at a higher dopant concentration than that of the first region, the contact area between the third region and the first region being smaller than that between the first region and the second region, wherein the process further comprises the steps of:

forming, prior to the formation of the first region, a device isolation region in the semiconductor layer, the device isolation region isolating a first semiconductor-device-forming section for forming the variable capacitance device from each of a second semiconductor-device-forming section and a third semiconductor-device-forming section;

forming, in the step of forming the first region, a fourth region in the second semiconductor-device-forming section, the fourth region containing the same conductivity type dopant as the first region;

forming a fifth region in the third semiconductor-device-forming section, the fifth region containing a second conductivity type dopant at a lower dopant concentration than that of the second region;

forming a gate electrode on each of the fourth and fifth regions;

forming, in the step of forming the second region, a sixth region in the fourth region by using the gate electrode as a mask, the sixth region containing the same conductivity type dopant as the second region; and forming, in the step of forming the third region, a seventh region in the fifth region by using the gate electrode as a mask, the seventh region containing the same conductivity type dopant as the third region.

2. A process for manufacturing a variable capacitance device according to claim 1, wherein the second region is formed in the inner periphery portion of the first region, and the third region is formed in the center of the first region and apart from the second region.

3. A process for manufacturing a variable capacitance device according to claim 1, wherein the second region is formed at one end of the first region, and the third region is formed at the other end of the first region.

4. A process for manufacturing a variable capacitance device according to claim 3, wherein the second region and the third region are located so as to be opposed to each other across the first region, and wherein the first region has an area in which the distance between the two side edges shortens gradually from the second region side toward the third region side.

5. A process for manufacturing a variable capacitance device according to claim 1, further comprising the step of, after masking the first region, siliciding the surface layers of the second and third regions.

* * * * *

UNITED STATES PATENT AND TRADEMARK OFFICE
CERTIFICATE OF CORRECTION

PATENT NO. : 6,867,107 B2
DATED : March 15, 2005
INVENTOR(S) : Akira Asai et al.

It is certified that error appears in the above-identified patent and that said Letters Patent is hereby corrected as shown below:

Title page,
Item [75], Inventors, change "Teruhito Ohnishi, Hirakata (JP)" to -- Teruhito Ohnishi, Osaka (JP) --;

Item [30], Foreign Application Priority Data, delete
"Dec. 11, 2002 (JP).........PCT/JP02/12949" and insert
-- Related U.S. Application Data
(63) Continuation of application No. PCT/JP02/12949, filed on Dec. 11, 2002 --.

Signed and Sealed this

Thirteenth Day of September, 2005

JON W. DUDAS
*Director of the United States Patent and Trademark Office*